United States Patent [19]
Ho

[11] Patent Number: 5,598,036
[45] Date of Patent: Jan. 28, 1997

[54] BALL GRID ARRAY HAVING REDUCED MECHANICAL STRESS

[75] Inventor: Tony H. Ho, Hsin-Chu, Taiwan

[73] Assignee: Industrial Technology Research Institute, Hsinchu, Taiwan

[21] Appl. No.: 490,855

[22] Filed: Jun. 15, 1995

[51] Int. Cl.⁶ .......................... H01L 23/58; H01L 23/48; H01L 23/52
[52] U.S. Cl. .................. 257/738; 257/673; 257/690; 257/692; 257/737; 257/780; 257/786
[58] Field of Search ................... 257/690, 692, 257/737, 738, 780, 673, 786

[56] References Cited

U.S. PATENT DOCUMENTS

| | | | |
|---|---|---|---|
| 4,807,021 | 2/1989 | Okumura | 357/75 |
| 4,918,514 | 4/1990 | Matsuda et al. | 357/79 |
| 5,214,308 | 5/1993 | Nishiguchi et al. | 257/692 |
| 5,216,278 | 6/1993 | Lin et al. | 257/675 |
| 5,220,200 | 6/1993 | Blanton | 257/778 |
| 5,233,504 | 8/1993 | Melton et al. | 361/760 |
| 5,250,848 | 10/1993 | Christie et al. | 257/778 |
| 5,334,857 | 8/1994 | Mennitt et al. | 257/48 |

*Primary Examiner*—Mahshid D. Saadat
*Assistant Examiner*—Valencia Martin Wallace
*Attorney, Agent, or Firm*—George O. Saile

[57] ABSTRACT

A semiconductor package, including semiconductor dies, a ball grid array, and a printed circuit board, is described. Said package has been designed with a view to minimizing its level of internal mechanical stress. This has been achieved through use of two sets of solder joints that have different melting points. The joints with the higher melting point are positioned in the region, on the ball grid array, where it is known that stress will be a maximum in the finished package. The lower melting point joints occupy the remaining positions on the underside of the ball grid array. Ball grid array and printed circuit board are attached to one another by heating at a temperature that is between the aforementioned two melting points.

22 Claims, 4 Drawing Sheets

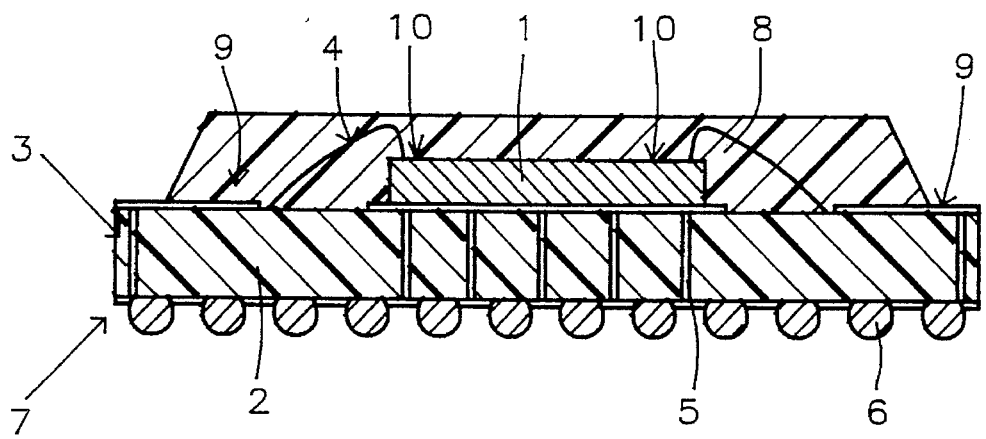
FIG. 1 — Prior Art
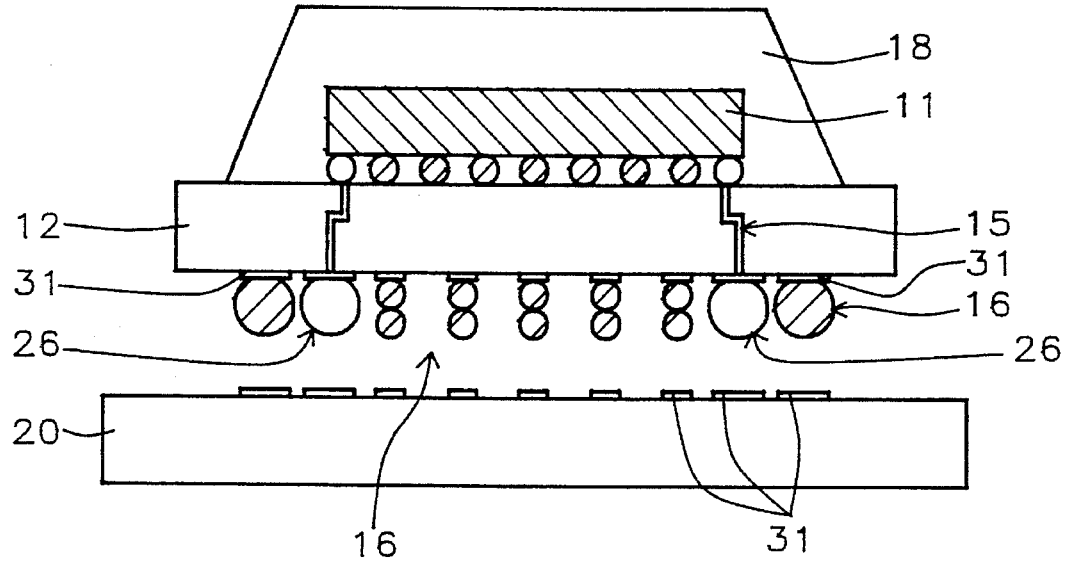
FIG. 2

BALL GRID ARRAY HAVING REDUCED MECHANICAL STRESS

BACKGROUND OF THE INVENTION

1. Field of the Invention

The invention relates to the general field of integrated circuit packaging, more particularly to ball grid arrays and how to attach them to printed circuit boards with minimum introduction of mechanical stress.

2. Description of the Prior Art

The wiring used for interconnection within a semiconductor chip is extremely fine, being of the order of a few microns, or less, in width. The abilty to form such wires has made possible chips containing hundreds of thousands, and more, interconnected components. At some point, however, contact must be made between the chips and the outside world where working to such small tolerances is not possible.

The most widely used medium for connecting chips to one another and/or the outside world is the printed circuit board (PCB). The term PCB is used here in a generic sense encompassing all types of printed circuit wiring, including what are known in the industry as cards and boards. The wiring on a PCB is much coarser than on a chip being typically measured in millimeters. It is not practical to connect chip wiring directly to PCB wiring. Therefore, an intermediate structure, capable of handling both ends of this wire-width spectrum, is needed.

An example of such a structure is a ball grid array (BGA), an example of which is shown in FIG. 1, in schematic cross-section. Semiconductor die 1 has been attached, face up, to the top surface of insulating substrate 2 comprised of ceramic, plastic, or glass, etc. Said top surface of the BGA is imprinted with fine wiring 9 that can be connected to the I/O (input-output) pads 10 of said die while the other surface is imprinted with relatively coarse wiring (not shown) with its own set of I/O pads (such as 6) in the form of solder balls or joints. The latter are distributed over an area that is substantially larger than the area occupied by the corresponding I/O pads on the chip, thereby making them more compatible with printed circuit wiring.

Multiple layers of wiring, embedded within the BGA substrate, serve to route signals from the various I/O pads on the chip to the appropriate solder joints on the other surface of the substrate. Vias directly below the die, such as 5, are generally used to transfer heat or to serve as ground connectors while other vias, such as 3, as generally used to carry signals. Solder mask 7 is located over those portions of the lower surface not occupied by the solder balls and serves to protect any wiring on that surface from contact with any excess solder exuded by the solder balls during melting.

The method of connection, from die to BGA, shown in FIG. 1 is but one of several that are in general use. For example, in flip chip technology the die is mounted face down and contact to the BGA is made through solder balls, rather than wire bonds such as 4 in FIG. 1. Yet another commonly used interconnection technique is Tape Automated Bonding, similar to wire bonding except that the wire bonds are preprinted on special tape and then removed (by virtue of being transferred to BGA and die) in a single operation. Also shown in FIG. 1 is a layer of encapsulating resin 8 which serves to protect the die from damage and/or contamination during its operating life.

It is not unusual to place more than one chip on a single BGA. In that case, connections between chips may be made via the aforementioned embedded wiring in addition to the rerouting of I/O locations previously discussed. It is also possible to locate discrete components, such as capacitors, on the BGA and connect them to the chips as well. The wiring density within such multi-chip-modules (MCMs) is greater than within the boards onto which they will be mounted, so MCMs can be used to achieve an overall reduction in package size relative to single chip modules.

Regardless of how many chips are located on a given BGA, the fully assembled package, comprising the unpackaged chip (or die), BGA, and PCB is subject to a substantial amount of internal mechanical stress as a consequence of thermal mismatch between its various parts. Furthermore, when the BGA is being bonded to the PCB by heating the assemblage in order to melt the solder joints, the weight of the BGA can cause significant distortion of the molten joints causing them to subsequently freeze in a barrel-like shape that has much built-in stress. This is generally not as severe a problem for the semiconductor die, even if it is attached through flip chip technology (i.e. solder joints connecting die to BGA), since it is much lighter than the BGA, so the surface tension of the molten solder joints, which pulls the molten solder into an hour-glass shape, dominates over the compression effect.

Another source of built-in stress can be introduced into the package if, as is commonly done, the semiconductor die is encapsulated in a protective plastic resin. Additionally, during its operating lifetime, the package will repeatedly be cycled over a relatively wide range of temperatures. This, in combination with the aforementioned built-in internal stresses, can lead to mechanical failure of the package.

A number of approaches to mitigating these various stress effects have already been proposed. For example, Christie et al. (U.S. Pat. No. 5,250,848 Oct. 5 1993) has disclosed the use of certain encapsulants to absorb the stress while Melton et al. (U.S. Pat. No. 5,233,504 Aug. 3 1993) and Okumura (U.S. Pat. No. 4,807,021 Feb 21 1989) use balls made of a relatively high melting point material that have been coated with a layer of soft material. During package assembly, the balls do not melt so the afore-mentioned collapse into the barrel shape does not occur. After assembly, the soft outer layer acts as a buffer to absorb some of the built-in or subsequently generated stress.

Blanton (U.S. Pat. No. 5,220,200 Jun. 15 1993) prevents the solder ball collapse (thus avoiding ending up with barrel shaped solder joints) by providing pillars that support the BGA during melting. Said pillars are built up out of metal paste laid down as part of several paste screening steps.

As will be shown below, none of these inventions anticipates the present invention.

SUMMARY OF THE INVENTION

It has been an object of the present invention to provide a semiconductor package, including semiconductor die, ball grid array and printed circuit board, that has minimum built-in stress and that is capable of effectively absorbing stresses introduced as a result of thermal cycling.

Another object of the invention has been to provide a method for forming such a package at a cost that is lower than that of other packages that also seek to accomplish the above goals.

Yet another object of the invention has been to provide a means for supporting the solder balls while they are in their molten state so that they do not become distorted and subsequently frozen in a barrel-like shape.

A further object of the invention has been to include with said package, at no additional cost, effective means for conducting heat away from the ball grid array to the printed circuit board.

These objects have been achieved by using two sets of solder joints, one set having a higher melting point than the other. The higher melting joints, which comprise a soft material, are positioned within the regions on the surface of the ball grid array where it has been previously determined that stress will be at a maximum. The lower melting set of solder joints is used to populate the remaining positions where solder joints would normally reside.

Attachment of the ball grid array to the printed circuit board is effected by heating at a temperature sufficient to melt only the lower melting joints, the non-melting joints serving as stand-offs to prevent the collapse of the molten ones. Once the package is back at room temperature, the higher melting joints, being of a soft material, are well suited for the absorption of stress and, in addition, are located in the optimum positions for doing so.

BRIEF DESCRIPTION OF THE DRAWINGS

FIG. 1 is a cross-section through a typical ball grid array.

FIGS. 2 and 3 show, in cross-section, how a ball grid array is attached to a printed circuit board, according to the design of the present invention.

DESCRIPTION OF THE PREFERRED EMBODIMENTS

Figure 3:
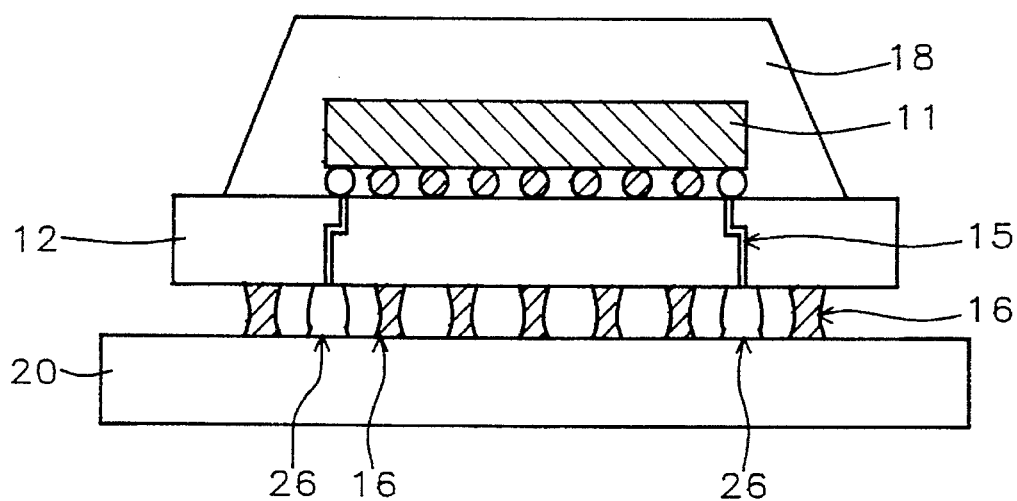

Referring now to FIG. 2, we show, in schematic cross-section, a ball-grid array similar to the one shown in FIG. 1 except that the semiconductor die 11 has been attached to the top surface of insulating substrate 12 through use of flip chip technology rather than wire bonding. As before, the die has been encapsulated in a plastic resin coating 18.

As part of the design of the structure shown in FIG. 2, computations were performed to determine where mechanical stress within substrate 12 would be at a maximum after the package had been fully assembled. The method used to determine said region of maximum stress was Finite Element Analysis which makes it possible to show contours for stress, temperature, displacement, etc. over the entire object that is under test, under various input conditions.

For the example shown in FIG. 2 (which happens to be a ceramic package) the region of maximum stress within the substrate was found to be located directly below the periphery of the attached semiconductor die. In a plastic ball grid array (PBGA) the region of maximum stress would be the first two rows underneath the chip edges. Thus, solder joints such as 26 in FIG. 2 would be located in a region of relatively high mechanical stress in the finished package while all the other solder joints, such as 16, for example, would be in a region of relatively low stress. As part of the present invention, this information has been applied to the design of a better package.

The solder joints, such as 26 in FIG. 2, that are located in the region of high stress comprise a material that is soft and whose melting point is relatively high. The solder joints, such as 16, that are located in the region of low stress comprise a material whose melting point is relatively low. During package assembly, the BGA is positioned to rest on the top surface of printed circuit board 20. I/O pads, such as solder pads 31, located in one-to-one correspondence with the solder joints that underlie the BGA, comprise areas of screened-on and cured metallic paste such as eutectic solder (63% tin, 37% lead). Solder flux can be used to replace solder pads under some circumstances.

The structure is then heated to a temperature somewhere between the melting points of the two sets of solder joints. Thus, solder joints such as 16 melt and wet the surfaces of the pads (such as 31) whereas solder joints such as 26 do not melt. Since solder joints such as 26 do not melt they serve to support substrate 12 in its position relative to PCB 20 when solder joints such as 16 do melt. Accordingly, the appearance of the latter is determined by the surface tension forces that are in effect while they are in the molten state. This results in them having an hour glass shape, as illustrated in FIG. 3 which depicts the package after it has cooled down. Note that solder joints, such as 26, which did not melt during the heat treatment, have a slightly barrel-shaped appearance as a result of their compression by the BGA during heating.

Thus, solder joints such as 26 serve several purposes that relate to stress relief. Their role in enabling the molten joints to assume the hour glass shape has already been noted. Since they are located in the region where high stress will be present in the the final assembly, the fact that they comprise a soft material enables them to absorb much of the total stress in the package. Since they did not melt during assembly there will be no stress induced in them, as they return to room temperature, by virtue of their own thermal contraction. Finally, they are available for use as thermal vias such as 15, i.e. conduits for heat generated in or near the BGA. Although the electrical contact resistance between solder joints such as 26 and pads such as 31 could be unacceptably high, (since wetting did not occur) their thermal contact resistance would still be low.

Figure 4:
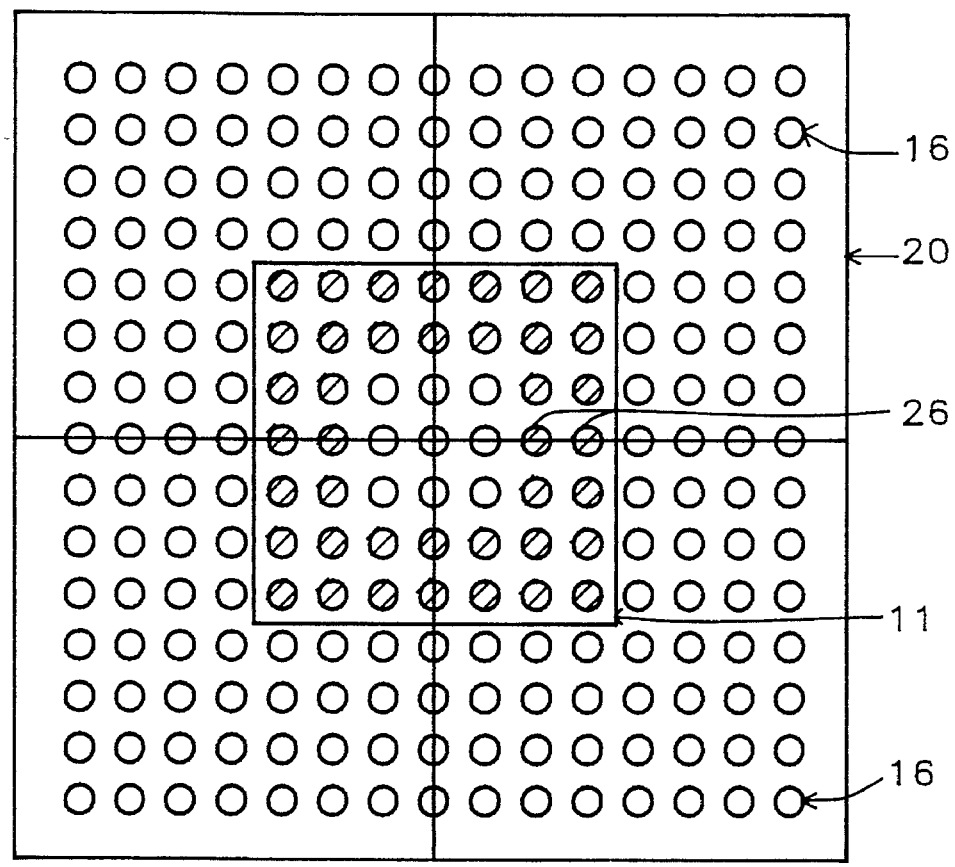
FIG. 4 is a plan view of a BGA such as that of FIG. 2.
Figure 5:
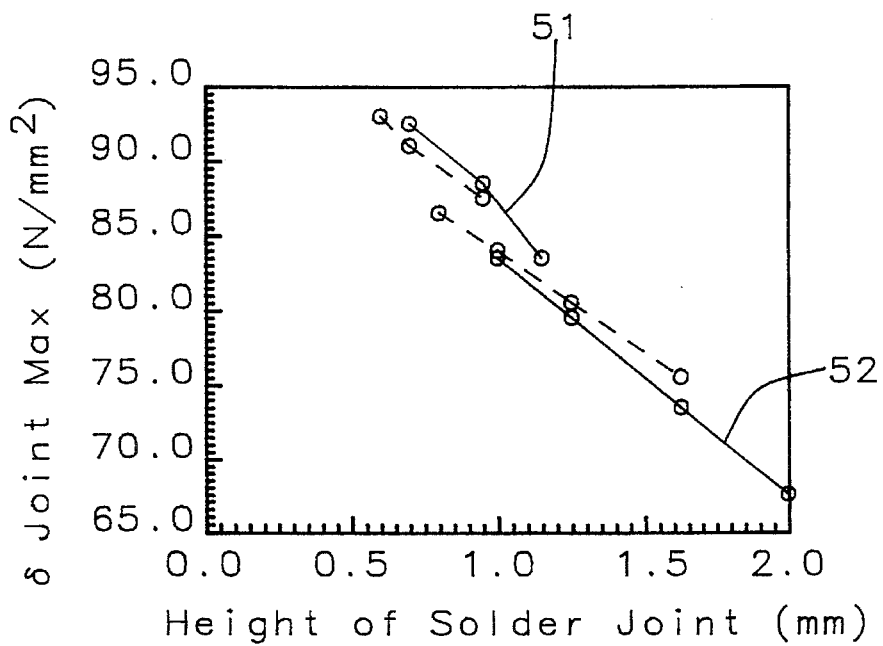
FIG. 5 is a curve relating the maximum stress in a solder joint to its height.

FIG. 4 shows a plan view of the underside of a ball grid array such as the one shown in cross-section in FIG. 2. The higher melting solder joints such as 26 can be seen to be located below the periphery of the attached semiconductor die 11. In PBGA packages stress in the solder joints is concentrated in the first two rows below the chip edges, as shown in FIG. 4. For the ceramic packages, however, the stress is concentrated in the two or three rows outside the package edges. Thus we replace the low melting eutectic solders in the high stress areas with high melting solders such as 10% tin, 90% lead thereby causing the separation between the two parts being soldered to remain fix (not collapse) during the reflow process. As shown in FIG. 5, as solder height is increased so do the lifetimes of the solder joints increase.

Materials that have been successfully used for the implementation of the present invention have included the lead-tin solders, the preferred alloy to use for the lower melting solder joints comprising 63% tin and 37% lead (which melts at 183° C.) and the alloy used for the higher melting solder joints comprising 10% tin and 90% lead (which is fully molten at 350° C.). Note that the 90/10 Pb/Sn alloy is subject to plastic flow at temperatures above 225° C. so that the preferred temperature range for heating the package is between 183° and 250° C. It should also be noted that the alloy compositions given here are for the purpose of illustrating the invention rather than limiting it. Thus, for the lead-tin system, the lower melting alloy could contain from 63% to 95% tin, while the higher melting alloy could contain from 5% to 30% tin and the temperature of the heat treatment could range from 150° to 240° C. for from 1 to 2 minutes. Furthermore, other alloy systems could be used with equal effectiveness. For example, (95%Pb,5%Sn), (93%Pb,5%Sn,2%Ag), (93%In,5%Sn,2%Ag), etc. etc. Note that in the last of these formulations lead has been replaced by indium. Substitution of indium for lead can be done in other lead-based solders in the same way.

Another way to further reduce stress in systems of this type is to increase the height of the solder joints, thereby allowing the strain associated with the stress to be spread out over a larger volume. This effect is illustrated in FIG. 5 which is a plot of the maximum bump stress (in Newtons/mm$^2$) vs. the height of the bump in mm. Curve 51 is for joints that froze into a barrel shape while curve 52 is for joints that froze into the hour glass shape.

Figure 6:
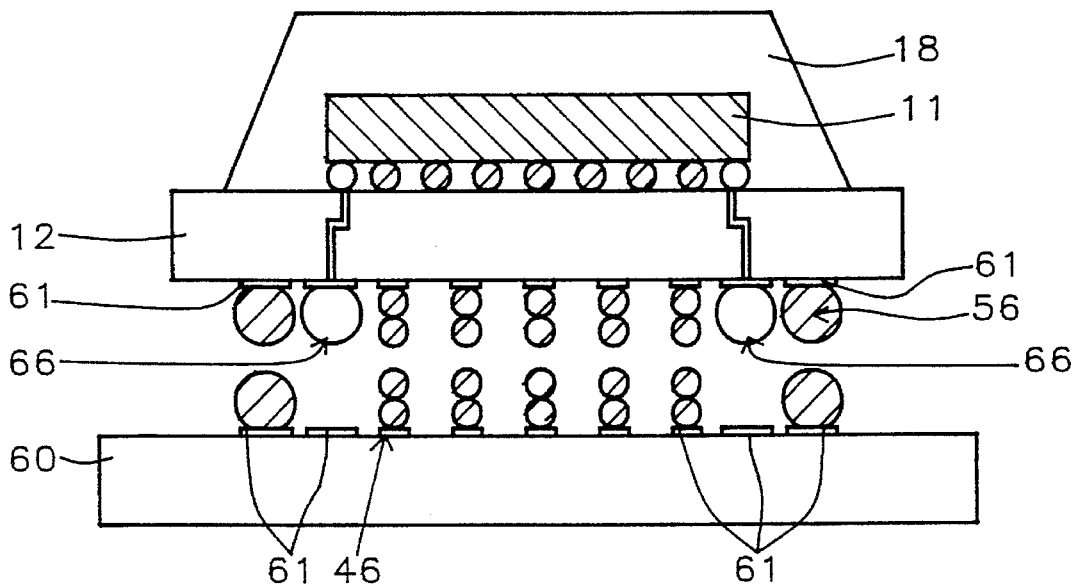
FIGS. 6–8 show a second embodiment of the invention wherein longer solder joints are achieved.

The following second embodiment of the invention was developed to exploit the above described advantage of longer joints. Referring to FIG. 6, the upper portion of the assembly is seen to be similar to the upper portion shown in FIG. 2. In the lower portion of FIG. 6 the metallic paste pads have been replaced by a set of solder joints, such as 46, that project in an upward direction from the top surface of PCB 60. These joints are approximately the same size as the joints in the upper portion (such as 56). The only exceptions are the stress relieving joints such as 66 in the upper portion. They continue to be matched to solder pads such as 61 in the lower portion and, accordingly, are twice as long as their counterparts in FIG. 2. This has been done to allow some tolerance in the event of slight misalignment during assembly. There is a built-in tolerance between pairs of molten joints when they are brought together, namely the surface tension forces that act to line them up again.

In this manner the reliability of solder joints in a plastic ball grid array can be greatly enhanced. Note that sometimes it may be advantageous if the mechanical solder joints are not limited to locations at the chip edges. In particular, it is more difficult to route signal lines to solder joints that are located at the package center. Hence, the solder joints at the center can be used as additional mechanical supports to increase the joint height of the whole plastic ball grid array package.

Figure 7:
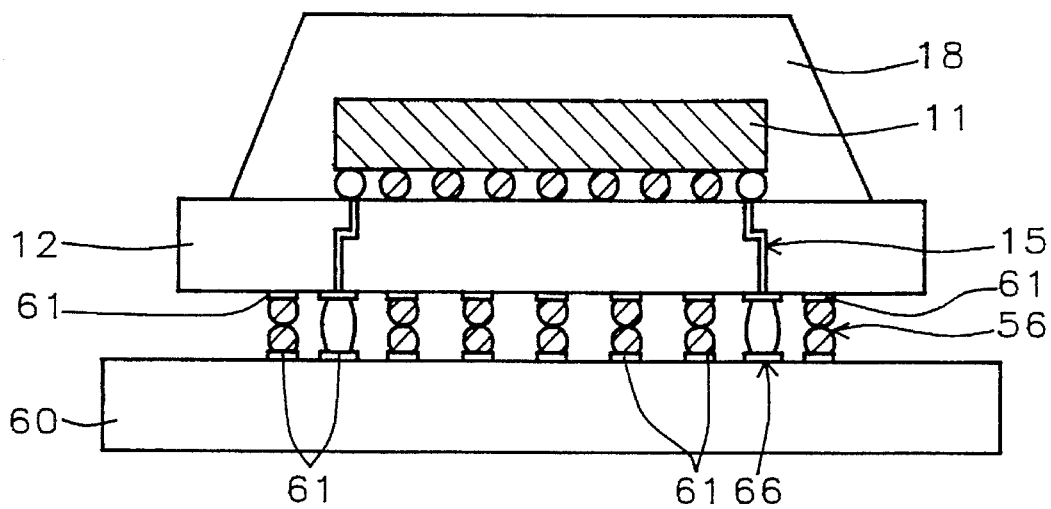
Figure 8:
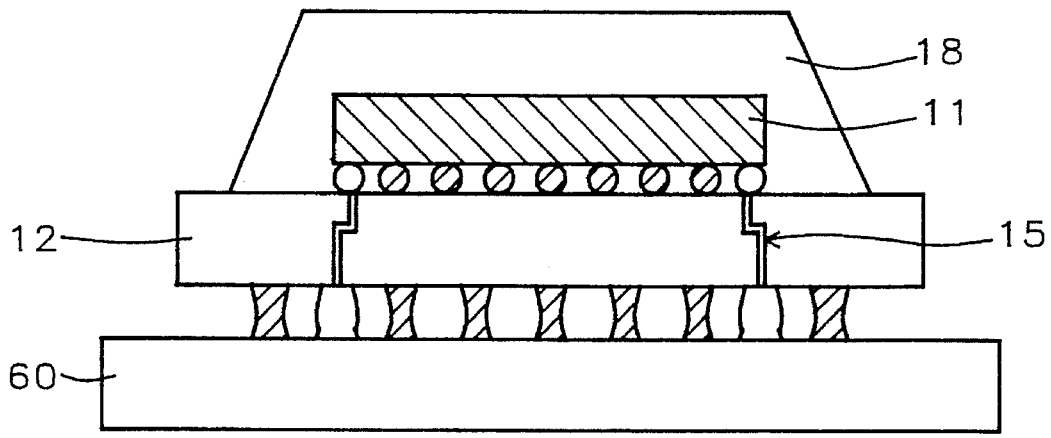

FIG. 7 illustrates the appearance of the system after the upper and lower portions have been brought into contact with one another while FIG. 8 shows the appearance of the package after heating. This completes our description of two embodiments. While the invention has been particularly shown and described with reference to these preferred embodiments, it will be understood by those skilled in the art that various changes in form and details may be made without departing from the spirit and scope of the invention.

What is claimed is:

1. A semiconductor packaging structure comprising:

an electrically insulating .mechanically stressed substrate having a top surface and a bottom surface;

a region of maximum mechanical stress within said substrate;

a semiconductor die mounted on said top surface;

means, located on said top surface, for electrically contacting selected areas on said die;

a first plurality of solder joints, integral with said bottom surface and projecting downwardly therefrom, positioned so as to underlie said region of maximum mechanical stress;

a second plurality of solder joints, integral with said bottom surface and projecting downwardly therefrom, having a lower melting point than said first plurality of solder joints and arranged as a regular array over said bottom surface, excepting locations occupied by said first plurality of solder joints; and wiring layers, embedded within said substrate between said top and bottom surfaces, for connecting said means for contacting the die to the solder joints.

2. The structure described in claim 1 further comprising:

a printed circuit board underlying said substrate and attached thereto by means of said solder joints; and selected areas on the surface of the printed circuit that is attached to said bottom surface, said selected areas comprising cured conductive paste and being positioned in one-to-one correspondence with the totality of solder joints on said bottom surface.

3. The structure described in claim 1 further comprising:

a printed circuit board underlying said substrate and attached thereto by means of said solder joints;

a third plurality of solder joints, comprising the same material as said first plurality of solder joints, located on the surface of the printed circuit board that is attached to the substrate, in one-to-one correspondence with said first plurality; and a fourth plurality of solder joints, comprising the same material as said second plurality of solder joints, located on the surface of the printed circuit board that is attached to the substrate, in one-to-one correspondence with said second plurality.

4. The structure described in claim 1 wherein said first plurality of solder joints comprises an alloy of from 70 to 95% lead and from 30 to 5% tin and said second plurality of solder joints comprises an alloy of from 5 to 40% lead and from 95 to 60% tin.

5. The structure described in claim 3 wherein said first and third pluralities of solder joints comprise an alloy of from 70 to 95% lead and from 30 to 5% tin and said second and fourth pluralities of solder joints comprise an alloy of from 5 to 40% lead and from 95 to 60% tin.

6. The structure described in claim 1 wherein at least one of the solder joints comprising said first plurality serves to conduct heat away from said semiconductor die to the bottom of said substrate.

7. The structure described in claim 1 wherein the material comprising said insulating substrate is taken from the group consisting of multilayer ceramic, fiber glass, plastic, and bismaleimide triazine.

8. The structure described in claim 2 wherein the material comprising said insulating substrate is taken from the group consisting of multilayer ceramic, fiber glass, plastic, and bismaleimide triazine.

9. The structure described in claim 3 wherein the material comprising said insulating substrate is taken from the group consisting of multilayer ceramic, fiber glass, plastic, and bismaleimide triazine.

10. The structure described in claim 3 wherein the material comprising said conductive paste further comprises (62% tin, 2% silver, and 36% lead) or (62% tin, 2% silver, and 36% indium).

11. The structure described in claim 1 wherein said means for electrically contacting selected areas on said die comprises wire bonding.

12. The structure described in claim 1 wherein said means for electrically contacting selected areas on said die comprises flip chip technology.

13. The structure described in claim 1 wherein said means for electrically contacting selected areas on said die comprises Tape Automated Bonding or card-on-board technology.

14. The structure described in claim 1 further comprising:
an encapsulating layer of molding epoxy covering said semiconductor die.

15. The structure described in claim 1 wherein said region of maximum mechanical stress is located immediately below, and just within, the periphery of said die.

16. The structure described in claim 1 wherein the number of semiconductor dies is at least two.

17. A method for forming a semiconductor package comprising:

providing at least one semiconductor die;

providing a ball grid array that includes a first and a second plurality of solder joints, said first plurality having a higher melting point than said second plurality;

attaching said semiconductor die to said ball grid array;

determining the region within said ball grid array where mechanical stress will be at a maximum once said semiconductor package has been fully assembled;

positioning said first plurality of solder joints within said region of maximum stress;

positioning said second plurality of solder joints as a uniform array on said ball grid array, excepting the positions occupied by said first plurality;

providing a printed circuit board; and attaching said ball grid array to said printed circuit board by heating the package to a temperature that is above the melting point of said second plurality of solder joints and below the melting point of said first first plurality of solder joints.

18. The method of claim 17 wherein the temperature at which the package is heated is below the temperature at which plastic flow begins for said first plurality of solder joints and above the melting point of said second plurality.

19. The method of claim 17 wherein the package is heated at a temperature between 183° and 220° C. for between 2 and 3 minutes.

20. The method of claim 17 wherein the determination of the region within said ball grid array where mechanical stress will be at a maximum, once said semiconductor package has been fully assembled, is achieved through finite element analysis.

21. The method of claim 17 wherein said first plurality of solder joints comprises an alloy of from 70 to 95% lead and from 30 to 5% tin and said second plurality of solder joints comprises an alloy of from 5 to 40% lead and from 95 to 60% tin.

22. The method of claim 21 wherein the package is heated at a temperature between 183° and 220° C. for between 2 and 3 minutes.

* * * * *